(12) United States Patent
Yamada

(10) Patent No.: US 8,150,064 B2
(45) Date of Patent: Apr. 3, 2012

(54) AUDIO OUTPUT DEVICE AND METHOD

(75) Inventor: Toshimi Yamada, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 773 days.

(21) Appl. No.: 12/206,868

(22) Filed: Sep. 9, 2008

(65) Prior Publication Data

US 2009/0092264 A1    Apr. 9, 2009

(30) Foreign Application Priority Data

Oct. 4, 2007    (JP) .................. 2007-261135

(51) Int. Cl.
H04B 15/00    (2006.01)

(52) U.S. Cl. .................. 381/94.1; 381/94.5; 381/120

(58) Field of Classification Search .................. 381/94.5, 381/94.7, 120, 123, 104, 121, 56, 58, 59, 381/28, 94.1; 350/51, 151; 330/51, 151; 330/9, 10, 251; 341/144; 379/395
See application file for complete search history.

(56) References Cited

U.S. PATENT DOCUMENTS

| 6,240,191 | B1 * | 5/2001 | Yoon .............................. 381/109 |
| 7,385,444 | B2 * | 6/2008 | Kurokawa ....................... 330/10 |
| 2005/0195991 | A1 * | 9/2005 | Wang et al. .................. 381/94.5 |
| 2006/0013413 | A1 * | 1/2006 | Sakaidani ....................... 381/104 |
| 2008/0204133 | A1 * | 8/2008 | Fontaine et al. ................ 330/69 |

FOREIGN PATENT DOCUMENTS

| JP | 7264066 | 10/1995 |
| JP | 2005159871 | 6/2005 |

* cited by examiner

Primary Examiner — Vivian Chin
Assistant Examiner — Friedrich W Fahnert
(74) Attorney, Agent, or Firm — Volentine & Whitt, PLLC

(57) ABSTRACT

An audio output device and method capable of preventing generation of pop noise by a relatively simple and small-sized circuit configuration and control timing. A D/A converter converts a digital audio signal to an analog audio signal. A non-inverting amplifier amplifies the analog audio signal. A signal output from the non-inverting amplifier is amplified by inverting amplifiers of two stages with a first timing. A signal output from an inverting amplifier is input to a speaker amplifier by a switch. The output signal of the inverting amplifier is output to a speaker with a second timing subsequent to the first timing. The output signal of the inverting amplifier is amplified by the speaker amplifier and output to the speaker. With a third timing subsequent to the second timing, the output of each of the inverting amplifiers is stopped and the output of the speaker amplifier is stopped.

7 Claims, 11 Drawing Sheets

AUDIO OUTPUT DEVICE AND METHOD

The present application claims priority under 35 U.S.C. 119 to Japanese patent application serial number 2007/261135, filed on Oct. 4, 2007, which is hereby incorporated by reference in its entirety for all purposes.

BACKGROUND OF THE INVENTION

1. Field of the Invention

The present invention relates to a sound or audio output device, and method capable of preventing the generation of pop noise or the like in an audio system or the like.

2. Description of the Related Art

In an audio system for example, noise called "Putt", or so-called pop noise, is generated from headphones, earphones or a speaker at power-on and power-off or the like. Techniques for reducing such pop noise have been proposed in, for example, Japanese Unexamined Patent Publication No. Hei 7(1995)-264066 and Japanese Unexamined Patent Publication No. 2005-159871 or the like.

A technique of using a digital/analog (hereinafter called "D/A") conversion apparatus capable of preventing the generation of pop noise and the like at power-on and power-off has been described in Japanese Unexamined Patent Publication No. Hei 7 (1995)-264066. This technique relates to the D/A conversion apparatus having a D/A converter which converts a digital signal to an analog signal, a left channel amplifier (hereinafter called "amp") and a right channel amp both of which amplify the output signal of the D/A converter, and two low-pass filters which remove high-frequency noise from output signals of the two amps. The D/A conversion apparatus is provided with two logic buffers with chip enable terminals, which have the output signal of the D/A converter input thereto and which send an output signal to the two amps; and a control circuit which sends a disable signal to the chip enable terminals during a source unstable period and which sends an enable signal to the chip enable terminals in a state in which a power source or power is stable.

A technique of using a pop noise reduction circuit capable of reducing pop noise generated at power-on and power-off of an audio amplifier has been described in Japanese Unexamined Patent Publication No. 2005-159871. The pop noise reduction circuit is provided with an A/D converter which supplies output data obtained by analog/digital (hereinafter called "A/D")-converting an output signal of an amplifier for amplifying an audio signal (sound signal); a control apparatus which fetches the output data, and which supplies to the amplifier data for giving a bias voltage for causing the output signal of the amplifier to assume a signal having a frequency of an audible band or a signal less unreproducable by a speaker, according to the output data; and a D/A converter which receives the supplied data, D/A-converts the same and supplies it to the amplifier as a bias voltage.

FIG. 11 is a schematic configuration diagram showing a conventional general audio output device. The audio output device has a D/A converter 1 which converts a digital audio signal to an analog audio signal. An amp 3 is connected to an output of amp 3 via a coupling capacitor 2. A left channel amp 4 and a right channel amp 5 are connected to the output of the amp 3. A speaker 6 having a load resistance of 8 μl is connected to the output of the two amps 4 and 5. In this type of audio output device as shown in FIG. 11, when a digital audio signal is input, the digital audio signal is converted to an analog audio signal by the D/A converter 1. The analog audio signal is amplified by the amp 3 via the coupling capacitor 2. Further, a signal output from the amp 3 is amplified by the left channel amp 4 and the right channel amp 5 respectively, and the amplified signal is thereafter output as an audio signal from the speaker 6.

In the circuit shown in FIG. 11, when the D/A converter 1 and the amps 3 through 5 are different in source voltage and the audio signals differ in center voltage from each other, coupling capacitor 2 performs alternating current (hereinafter called "AC") coupling to thereby separate direct current (hereinafter called "DC") components. Further, at power-up (power-on) and power-down (power-off), coupling capacitor 2 assumes the role of preventing addition of a DC offset voltage of the D/A converter 1 to DC offset voltages of the amps 3 through 5, and preventing the output of pop noise.

In general, an audible sound determinable to be pop noise corresponds to a change of 10 mV or more in DC level, and is defined as a frequency component up to 20 kHz. As described in Japanese Unexamined Patent Publication No. 2005-159871, there is also known a method of raising a reference voltage of each amp stepwise by a D/A converter and thereby reducing pop noise.

However, when the method for inserting the coupling capacitor 2 between the D/A converter 1 and the amps 3 through 5 is implemented by a semiconductor device, the conventional audio output device needs to operate at the center voltages (reference voltages) on the amps 3 to 5 sides, in order to prevent the generation of pop noise or the like. At this time, a problem arises in that since the input side of the amp 3 assumes a high-pass filter (high-frequency band-pass filter) having coupling capacitor 2 and resistance when the amp 3 is configured by for example an inverting amplifier having an input resistor, a capacitance value of 1 μF or so is required considering a pass area of an audio signal, thereby necessitating a huge layout area. When the sheet capacitance value of the coupling capacitor 2 is 1 fF [μm$^2$], for example, a layout area of 31.6 [mm]×31.6 [mm] is required. In order to be implemented realistically, the semiconductor device would need an external capacitance, with the resultant drawback of additional of external parts.

As described in Japanese Unexamined Patent Publication No. 2005-159871, the method of controlling the reference voltages of the amps 3 through 5 is accompanied by problems that a control circuit is additionally required, and the layout area increases.

SUMMARY OF THE INVENTION

In order to solve the above problems, it is an object of the present invention to provide an audio output device and method capable of preventing pop noise by a relatively simple and small-sized circuit configuration and control timing.

According to one aspect of the present invention, for attaining the above object, there is provided an audio output device including a digital/analog converter that converts a digital audio signal to an analog audio signal; a first amplifier that is activated along with the digital/analog converter and that amplifies the analog audio signal with a predetermined center voltage as a reference to provide an output signal; a second amplifier that is activated responsive to a first logic level of a first enable signal that has transitioned to the first logic level from a second logic level at a first timing subsequent to activation of the first amplifier to amplify the output signal of the first amplifier to provide a first amplified signal, that outputs the first amplified signal to an electricity/audio converter, and that stops output of the first amplified signal to the electricity/audio converter responsive to the second logic level of the first enable signal at a third timing subsequent to the first timing; and a third amplifier that has the first amplified signal input thereto responsive to the first logic level of the first enable signal at the first timing, that is activated responsive to a third logic level of a second enable signal that has transitioned to the third logic level from a fourth logic level at a second timing between the first and third timings to amplify the first amplified signal to provide a second amplified signal, that outputs the second amplified signal to the electricity/audio converter, and that stops output of the second amplified signal to the electricity/audio converter responsive to the fourth logic level of the second enable signal at the third timing.

According to another aspect of the present invention, for attaining the above object, there is provided an audio output device including a digital/analog converter that is activated responsive to a first logic level of a first enable signal that has transitioned to the first logic level from a second logic level at a first timing to convert a digital audio signal to an analog audio signal at a second timing subsequent to the first timing, that outputs the analog audio signal, and that stops output of the analog audio signal responsive to the second logic level at a third timing subsequent to the second timing; a first amplifier that is activated responsive to the first logic level at the first timing to amplify the analog audio signal at the second timing with a predetermined center voltage as a reference to provide an output signal, and that stops output of the output signal responsive to the second logic level of the first enable signal; a second amplifier that is activated responsive to a third logic level of a second enable signal that has transitioned to the third logic level from a fourth logic level to amplify the output signal of the first amplifier at the second timing to provide a first amplified signal, that outputs the first amplified signal to a first audio output terminal, and that stops output of the first amplified signal to the first audio output terminal responsive to the fourth logic level of the second enable signal; a third amplifier that has the first amplified signal input thereto responsive to the third logic level of the first enable signal, that is activated responsive to a fifth logic level of a third enable signal that has transitioned to the fifth logic level from a sixth logic level to amplify the first amplified signal, that outputs a second amplified signal to a second audio output terminal, and that stops output of the second amplified signal to the second audio output terminal responsive to the sixth logic level of the third enable signal; a switch which is brought to an ON state responsive to a seventh logic level of a fourth enable signal that has transitioned to the seventh logic level from an eighth logic level at the second timing to provide the output signal of the first amplifier to the first audio output terminal, and that is brought to an OFF state responsive to the eighth logic level of the fourth enable signal at a predetermined timing subsequent to the third timing to stop output of the output signal to the first audio output terminal; and an output controller that controls an output from the first audio output terminal, based on a logical OR of the second and fourth enable signals.

According to a further aspect of the present invention, for attaining the above object, there is provided an audio output method including converting a digital audio signal to an analog audio signal; a first amplifying that amplifies the analog audio signal using a predetermined center voltage as a reference to provide an output signal; a second amplifying that amplifies the output signal at a first timing subsequent to activation of said first amplifying, said second amplifying activated responsive to a first logic level of a first enable signal that has transitioned to the first logic level from a second logic level, to output a first amplified signal; a third amplifying that amplifies the first amplified signal responsive to a third logic level of a second enable signal that has transitioned to the third logic level from a fourth logic level, to output a second amplified signal, the first amplified signal provided for said third amplifying responsive to the first logic level of the first enable signal; applying the first amplified signal to an electricity/audio converter at a second timing subsequent to the first timing; providing the second amplified signal to the electricity/audio converter; stopping output of the first amplified signal responsive to the second logic level of the first enable at a third timing subsequent to the second timing; and stopping output of the second amplified signal responsive to the fourth logic level of the second enable signal.

According to a still further aspect of the present invention, for attaining the above object, there is provided an audio output method including converting a digital audio signal to an analog audio signal, said converting activated responsive to a first logic level of a first enable signal that has transitioned to the first logic level from a second logic level at a first timing, when a reference voltage is provided for said converting at a second timing subsequent to the first timing; a first amplifying that amplifies the analog audio signal using a predetermined center voltage as a reference to provide an amplified signal, said first amplifying activated responsive to the first logic level of the first enable signal; providing the amplified signal to an audio output terminal via a switch brought to an ON state by a third logic level of a second enable signal that has transitioned to the third logic level from a fourth logic level; transitioning the first enable signal to the second logic level at a third timing subsequent to the second timing, to deactivate said converting and said amplifying; and stopping output from the audio output terminal responsive to transition of the second enable signal to the fourth logic level at a fourth timing subsequent to the third timing.

According to the audio output device of the present invention, an audio signal is directly output without AC-coupling a D/A-converted analog audio signal by means of a coupling capacitor. Therefore, the generation of pop noise can be prevented by a relatively simple circuit configuration. Further, a layout area can be reduced in the case where the audio output device is formed of a semiconductor device or the like.

According to the audio output method of the present invention, there is provided a method of directly outputting an audio signal without AC-coupling a D/A-converted analog audio signal by means of a coupling capacitor. It is therefore possible to prevent the generation of pop noise by relatively simple control timing.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

An audio output device includes a D/A converter which converts a digital audio signal to an analog audio signal, a non-inverting amplifier activated along with the D/A converter to amplify and output the analog audio signal with a predetermined center voltage as a reference, first and second inverting amplifiers of two stages, and a third inverting amplifier.

Here, the first and second inverting amplifiers of two stages are activated responsive to a first logic level of a first enable signal that has transitioned to the first logic level (e.g., "1") from a second logic level (e.g., "0") at a first timing subsequent to the activation of the non-inverting amplifier to amplify the output signal of the non-inverting amplifier and to output the same to an electricity/audio converter (e.g., speaker), and the first and second inverting amplifiers stop the output thereof to the electricity/audio converter responsive to the second logic level of the first enable signal at a third timing subsequent to the first timing.

Further, the third inverting amplifier has the output signal of the second inverting amplifier input thereto responsive to the first logic level of the first enable signal at the first timing, and the third inverting amplifier is activated responsive to a third logic level of a second enable signal that has transitioned to the third logic level (e.g., "1") from a fourth logic level (e.g., "0") at a second timing between the first and third timings, to amplify the output signal of the second inverting amplifier and output the same to the electricity/audio converter, and the third inverting amplifier stops the output thereof to the electricity/audio converter responsive to the fourth logic level of the second enable signal at the third timing.

Figure 1:
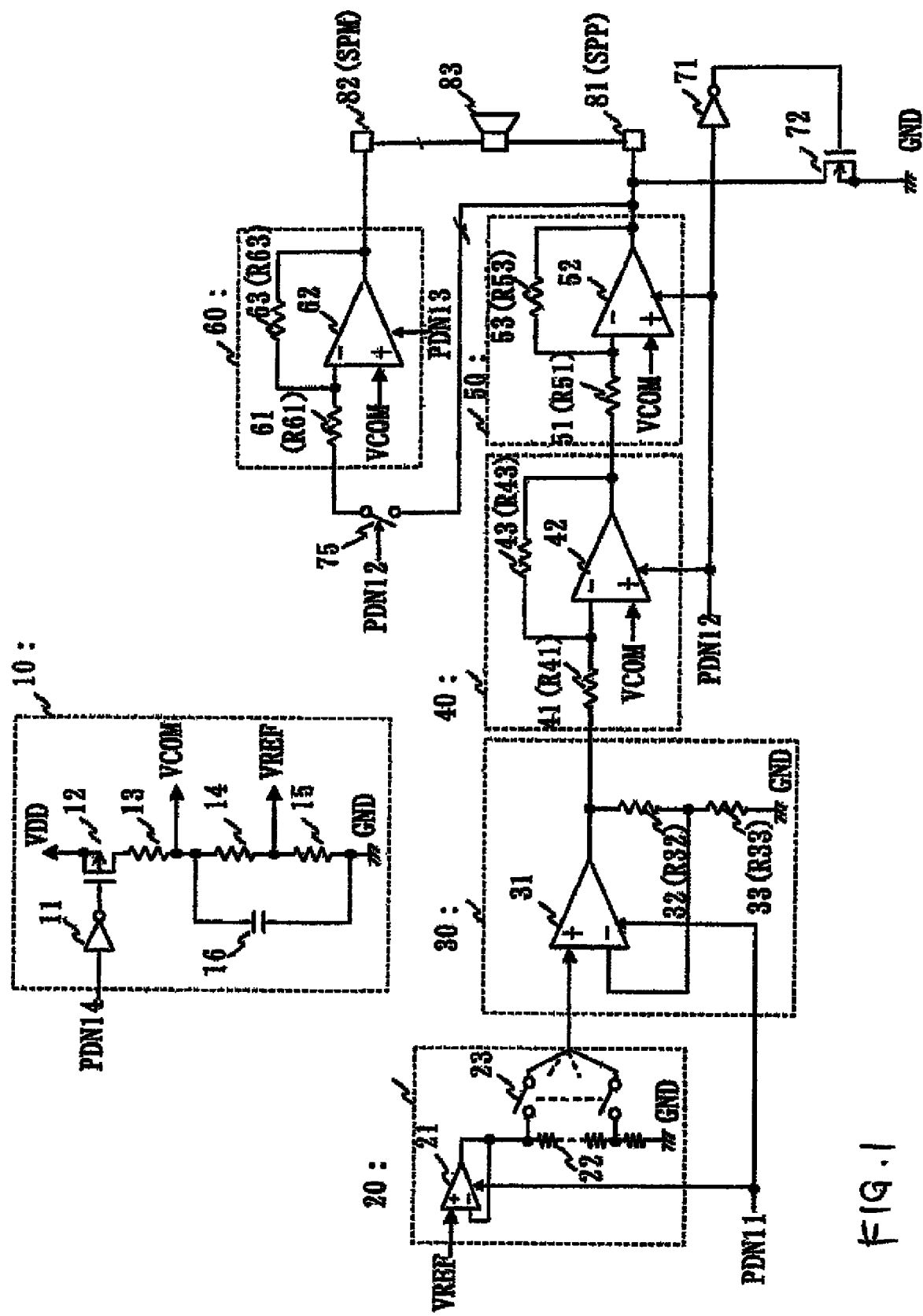
FIG. 1 is a schematic configuration diagram showing an audio output device illustrative of a first preferred embodiment of the present invention.

FIG. 1 is a schematic configuration diagram showing a sound or audio output device illustrative of a first embodiment of the present invention. The audio output device comprises a reference voltage generating circuit 10 which is activated by a power-down signal PDN14 corresponding to an enable signal to generate reference voltages VCOM and VREF, and a D/A converter 20. The D/A converter 20 is for example a 16-bit resistance ladder type D/A converter which is activated in response to a "1" logic level of a power-down signal PDN11, which corresponds to an enable signal that transitions between a first logic level (e.g., "1") and a second logic level (e.g., "0"), to convert a digital audio or sound signal to an analog audio or sound signal based on the reference voltage VREF. A first amplifier (e.g., non-inverting amplifier) 30 is connected to the output side of the D/A converter 20. The non-inverting amplifier 30 is a circuit which is activated in response to an ON level (="1") of the power-down signal PDN11 to amplify the output signal of the D/A converter 20 with the same phase. A second amplifier (e.g., inverting amplifier 40 and speaker amplifier 50) is connected to the output side of the non-inverting amplifier 30.

The first-stage inverting amplifier 40 is a circuit which is activated in response to an ON level (="1") of a first enable signal (e.g., power-down signal) PDN12 to amplify the output signal of the non-inverting amplifier 30, based on the reference voltage VCOM: The second-stage speaker amplifier 50 is connected to the output side of the inverting amplifier 40. The second-stage speaker amplifier 50 includes an inverting amplifier and is activated in response to an ON level (="1") of the power-down signal PDN12 to amplify the output signal of the inverting amplifier 40, based on the reference voltage VCOM. A third amplifier (e.g., speaker amplifier) 60, an output controller, and a first audio output terminal 81 through which an audio or sound output signal SPP on the right channel (+) side is output are connected to the output side of speaker amplifier 50. The output controller includes for example an inverter 71 which inverts the power-down signal PDN12, and a switch element (e.g., an N channel type MOS transistor which is hereinafter called "NMOS") 72 which is connected between the first audio output terminal 81 and a constant potential node (e.g., ground) GND and which is ON/OFF-operated in response to a signal output from the inverter 71.

The speaker amplifier 60 includes an inverting amplifier 62 which has the output signal of the inverting amplifier 50 input thereto via a switch 75 such as a transistor that is ON/OFF-controlled by an ON level (="1") of the power-down signal PDN12, and the inverting amplifier 62 is activated in response to an ON level (="1") of a second enable signal (e.g., power-down signal) PDN13 to amplify the output signal of the inverting amplifier 50 based on the reference voltage VCOM. A second audio output terminal 82, which outputs an audio output signal SPM on the left channel (−) side, is connected to the output side of speaker amplifier 60. An electricity/audio converter (e.g., a speaker having a load resistance of 8Ω) 83 is externally connected between the first and second audio output terminals 81 and 82. Configurations of the respective circuits will be explained as follows.

The reference voltage generating circuit 10 has an inverter 11 which inverts the power-down signal PDN14, a P channel type MOS transistor (hereinafter called "PMOS") 12 whose state of conduction is controlled by a signal output from the inverter 11, division resistors 13 through 15 which generate the reference voltages VCOM and VREF, and a capacitor 16. The PMOS 12 and the division resistors 13 through 15 are connected in series between a VDD node to which a source voltage VDD is applied, and the ground GND. The gate of the PMOS 12 is connected to an output terminal of the inverter 11, and the bulk of the PMOS 12 is connected to the VDD node. The capacitor 16 is connected in parallel to the division resistors 14 and 15. The reference voltage VCOM is taken out from between the division resistors 13 and 14, whereas the reference voltage VREF is taken out from between the division resistors 14 and 15.

The 16-bit resistance ladder type D/A converter 20 has a buffer amplifier 21 which is activated by the power-down signal PDN11 and has the reference voltage VREF input thereto. 216 ladder resistors 22 are connected to an output terminal of the buffer amplifier 21. Any one of the 216 ladder resistors 22 is selected by a switch 23 that is ON/OFF-operated in response to an input digital audio signal, and the voltage applied thereto is output to the non-inverting amplifier 30.

The non-inverting amplifier 30 has an amplifier main body 31 activated by the power-down signal PDN11. A (+) side input terminal of the amplifier main body 31 is connected to an output terminal of the switch 23. A (−) side input terminal thereof is connected to an output terminal of the amplifier main body 31 via a resistor 32 having a resistance value R32. The resistor 32 is connected to the ground GND via a resistor 33 having a resistance value R33. The non-inverting amplifier 30 has input thereto the output signal of the switch 23, and multiplies the output signal of switch 23 by (1+R32/R33) through the resistors 32 and 33. The inverting amplifier 40 is connected to the output side of non-inverting amplifier 30.

The inverting amplifier 40 has an input resistor 41 having a resistance value R41 connected to the output terminal of the amplifier main body 31. The input resistor 41 is connected to a (−) side input terminal of an amplifier main body 42 which is activated by the power-down signal PDN12. The reference voltage VCOM is input to a (+) side input terminal of the amplifier main body 42. A feedback resistor 43 having a resistance value R43 is connected between the (−) side input terminal of the amplifier main body 42 and its output terminal. The inverting amplifier 40 is activated by the power-down signal PDN12, and multiplies the signal input to the input resistor 41 by (−R43/R41) through the input resistor 41 and the feedback resistor 43. The speaker amplifier 50 is connected to the output side of inverting amplifier 40.

The speaker amplifier 50 has an input resistor 51 having a resistance value R51 connected to an output terminal of the amplifier main body 42. The input resistor 51 is connected to a (−) side input terminal of an amplifier main body 52 which is activated by the power-down signal PDN12. The reference voltage VCOM is input to a (+) side input terminal of the amplifier main body 52. A feedback resistor 53 having a resistance value R53 is connected between the (−) side input terminal of the amplifier main body 52 and its output terminal. The speaker amplifier 50 is activated by the power-down signal PDN12 and multiplies the signal input to the input resistor 51 by (−R53/R51) through the input resistor 51 and the feedback resistor 53. The output side of the speaker amplifier 50 is connected to the ground GND via the drain/source of the NMOS 72 and connected to the speaker amplifier 60 via the switch 75. The bulk of the NMOS 72 is connected to the ground GND.

The speaker amplifier 60 has an input resistor 61 having a resistance value R61 connected to the switch 75, in a manner similar to the speaker amplifier 50. The input resistor 61 is connected to a (−) side input terminal of an amplifier main body 62 which is activated by the power-down signal PDN13. The reference voltage VCOM is input to a (+) side input terminal of the amplifier main body 62. A feedback resistor 63 having a resistance value R63 is connected between the (−) side input terminal of the amplifier main body 62 and its output terminal. The speaker amplifier 60 is activated by the power-down signal PDN13, and multiplies the signal input to the input resistor 61 by (−R63/R61) through the input resistor 61 and the feedback resistor 63. The second audio output terminal 82 is connected to the output side of the circuit.

Figure 2:
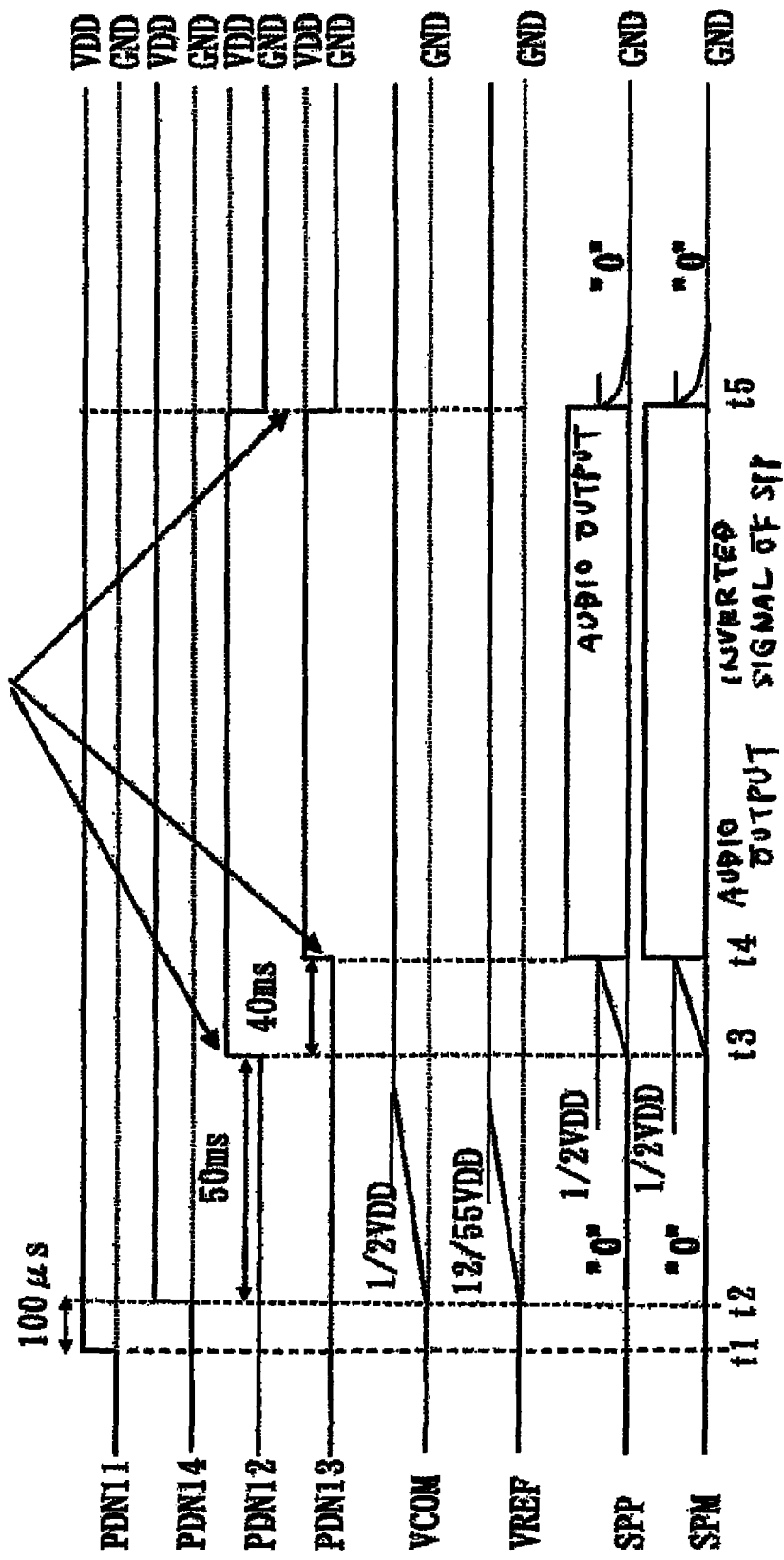
FIG. 2 is a timing chart showing an audio output method suitable for use in the audio output device shown in FIG. 1.

FIG. 2 is a timing chart showing one example of an audio or sound output method suitable for use in the audio output device shown in FIG. 1. A description of on-startup of sound will first be explained.

It is to be assumed that prior to a time t1 in FIG. 2, the power-down signals PDN11, PDN12, PDN13 and PDN14 are respectively in an OFF state ("0"=GND level=0V) and the reference voltages VREF and VCOM are respectively in a startup-free state (=0V). Moreover, it is assumed that when the power-down signals PDN11 through PDN13 are OFF, the output signal of the D/A converter 20 is 0V, the output signal of the non-inverting amplifier 30 is 0V, and the inverting amplifier 40 and speaker amplifiers 50 and 60 per se are respectively in a high impedance (hereinafter called "Hi-Z") output state. Since the gate of the NMOS 72 is of a VDD level, the NMOS 72 is turned ON so that the audio output signal SPP from the audio output terminal 81 is brought to 0V. Also the switch 75 is turned OFF, and the audio output terminal 82 for outputting the audio output signal SPM is thus brought to 0V to connect to the audio output terminal 81 for outputting the audio output signal SPP, via the external speaker 83. Incidentally, the output range of the D/A converter 20 extends from 4/55×VDD to the reference voltage VREF (=20/55× VDD), for example.

At the time t1 in FIG. 2, a digital value brought to a center voltage output (12/55×VDD) is input to the D/A converter 20, to bring the power-down signal PDN11 to an ON state (it changes from 0V to VDD (source) level). While the D/A converter 20 is started up, its output signal is 0V because the reference voltage VREF is not yet started.

At a time t2 in FIG. 2, the power-down signal PDN14 is brought to an ON state after 100 μs has elapsed from the turning ON of the power-down signal PDN11, and the reference voltages VCOM (=½×VDD) and VREF of the reference voltage generating circuit 10 are started up. The reference voltages VCOM and VREF are respectively voltages which rise with the time constant of the resistors 13 through 15 and the capacitor 16. Since the time of 100 μs corresponds to the time taken until the non-inverting amplifier 30 becomes stable, it is variable by the stable speed of the non-inverting amplifier 30. The non-inverting amplifier 30 produces an output at a multiplying power of 55/24 with respect to the input signal, with the ratio of the resistance values R32/R33 as 31/24. Thus, the center voltage of the output signal of the non-inverting amplifier 30 becomes ½×VDD (=12/55×55/24×VDD).

At a time t3 in FIG. 2 corresponding to a first timing, the power-down signal PDN12 is brought to ON after 50 ms from the turning ON of the power-down signal PDN14. At this time, the D/A converter 20 and the reference voltages VCOM and VREF are respectively brought to a stable voltage, and hence the output signal of the non-inverting amplifier 30 reaches a stable voltage of ½×VDD. Since the gate of the NMOS 72 is of the VDD level until the power-down signal PDN12 is brought to ON, the NMOS 72 is turned ON to bring the audio output signal SPP to 0V until time t3. Incidentally, since 50 ms corresponds to the time determined from the time constant of the resistors 13 through 15 and the capacitor 16, it can be changed.

At a time t4 in FIG. 2 corresponding to a second timing, the power-down signal PDN13 is brought to an ON state after 40 ms from the turning ON of the power-down signal PDN12. At this time, the inverting amplifier 40 and the audio output signal SPP of the speaker amplifier 50 are assumed to be stable at the voltage of ½×VDD within 40 ms. The audio output signal SPM also takes the same operation as the audio output signal SPP following the audio output signal SPP. A digital audio signal (digital-coded audio or sound signal) is input to the input of the D/A converter 20 (switch 23) from the time of turning ON of the power-down signal PDN13. Since the switch 75 is turned ON and thereby the gate of the NMOS 72 is brought to 0V, the NMOS 72 is turned OFF so that an analog audio output signal SPP is output from the audio output signal terminal 81 and the output of the inversion of the audio output signal SPP is started from the audio output signal SPM. Although the 40 ms time depends on the resolution of the D/A converter 20, it can be changed if one code step of the D/A converter 20 is stepped up within 10 mV. Incidentally, the ratio between a resistance value R41/R43 and a resistance value R51/R53 is assumed to be 1.

The stop of sound will next be explained. At a time t5 in FIG. 2 corresponding to a third timing, the power-down signal PDN12 and the power-down signal PDN13 are simultaneously brought to an OFF state (="0") in an audio sent-out state. Since the gate of the NMOS 72 is brought to the VDD level with the OFF state of the power-down signal PDN12, the NMOS 72 is turned ON so that the audio output signals SPP and SPM are brought to 0V at the time constant of unillustrated phase compensation capacitors lying within the speaker amplifiers 50 and 60 and the on resistance of the NMOS 72. Effects of first preferred embodiment are described as follows.

Figure 3:
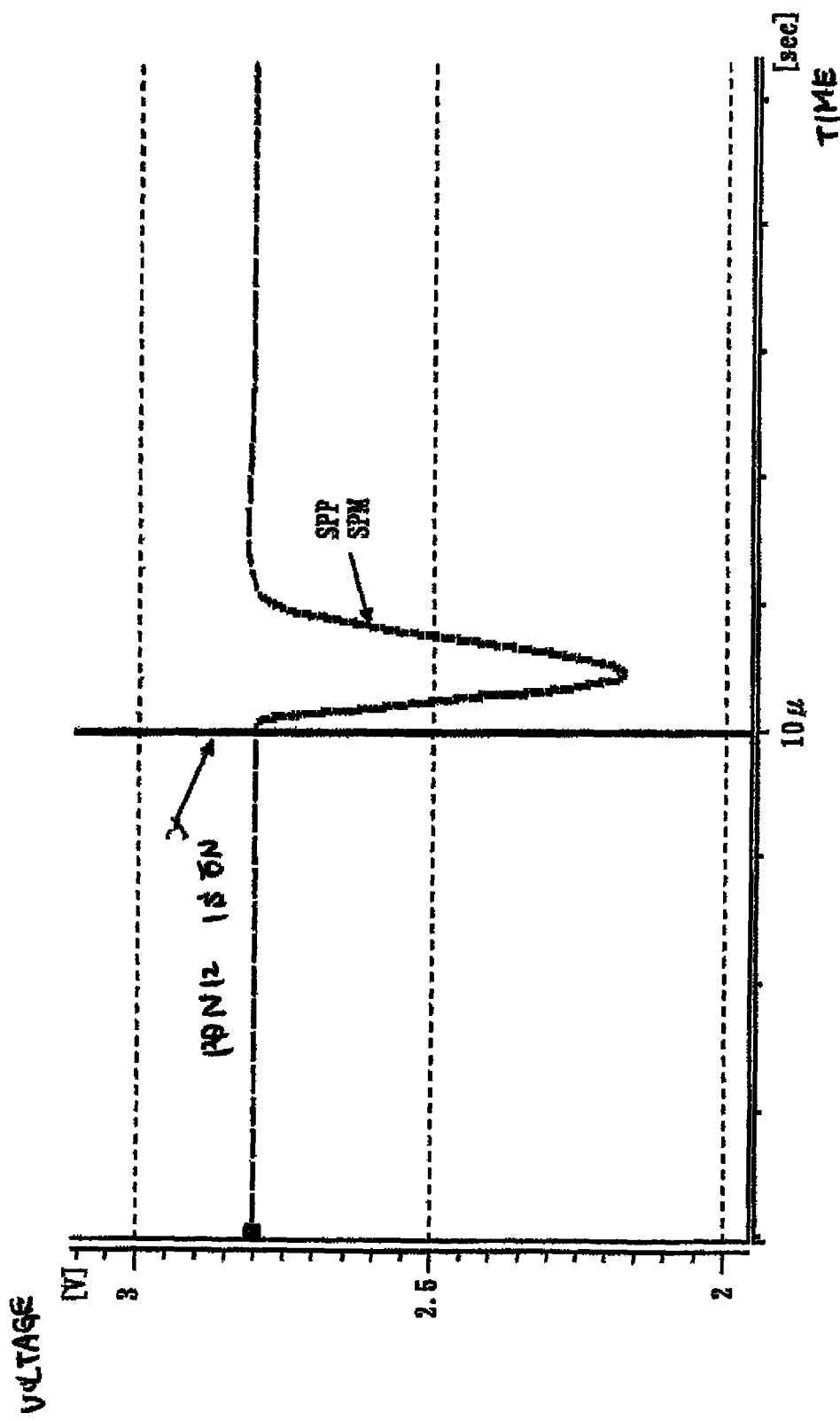
FIG. 3 is a voltage waveform diagram illustrating audio output signals SPP and SPM in FIG. 2.
Figure 4:
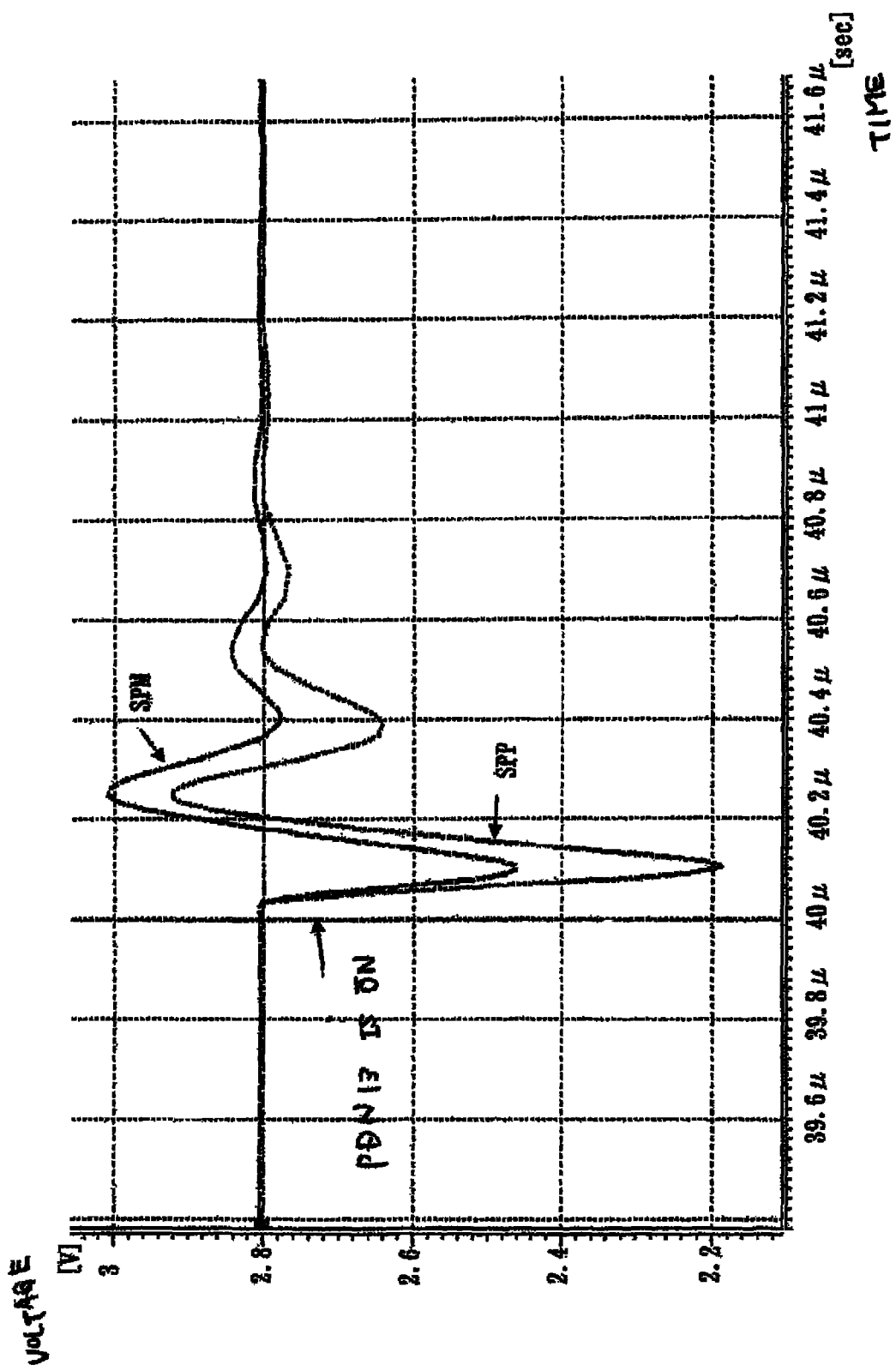
FIG. 4 is a voltage waveform diagram illustrating audio output signals SPP and SPM in FIG. 2.
Figure 5:
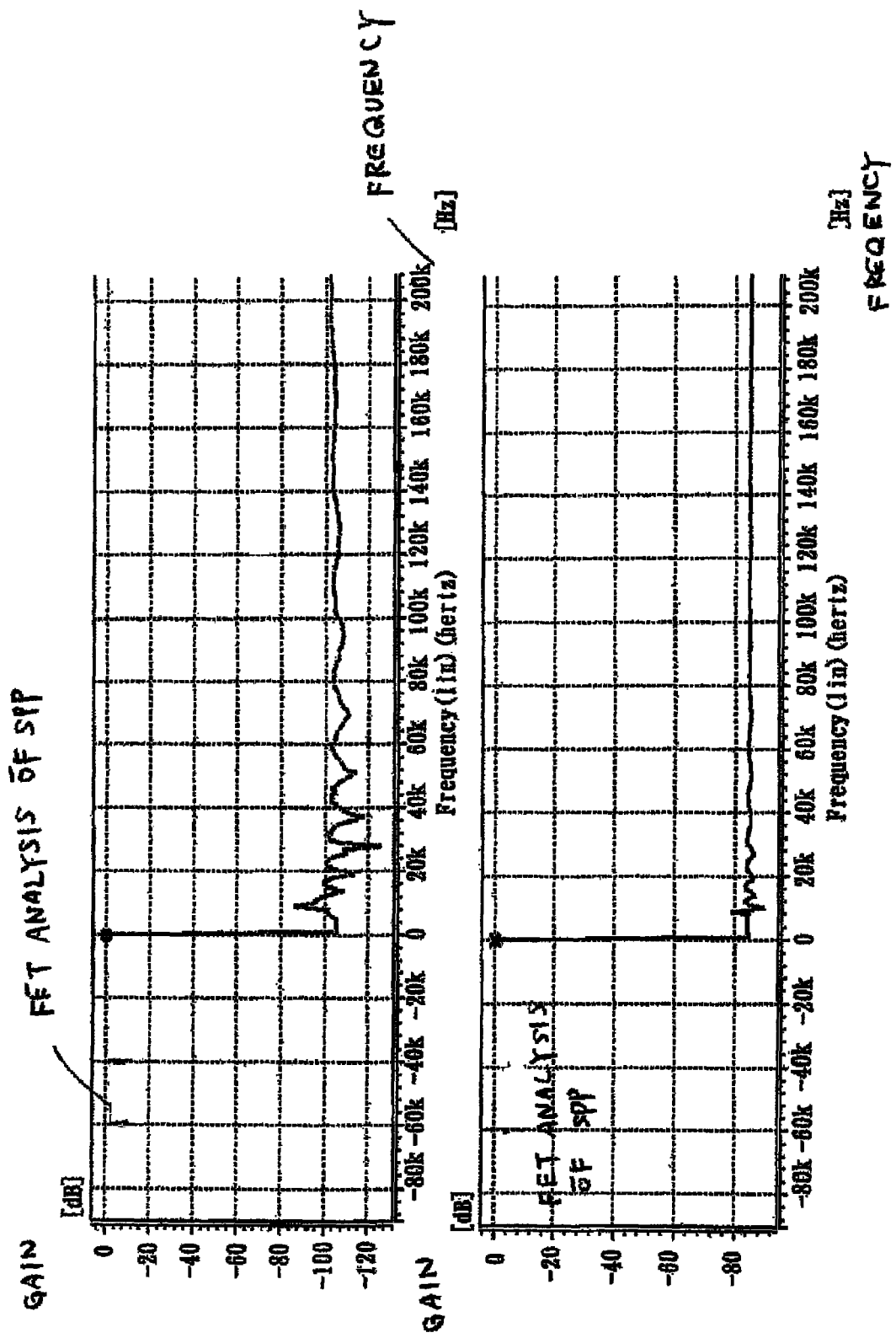
FIG. 5 is an analytical diagram of Fast Fourier Transform (FFT) showing audio output signals SPP and SPM in FIG. 2.
Figure 6:
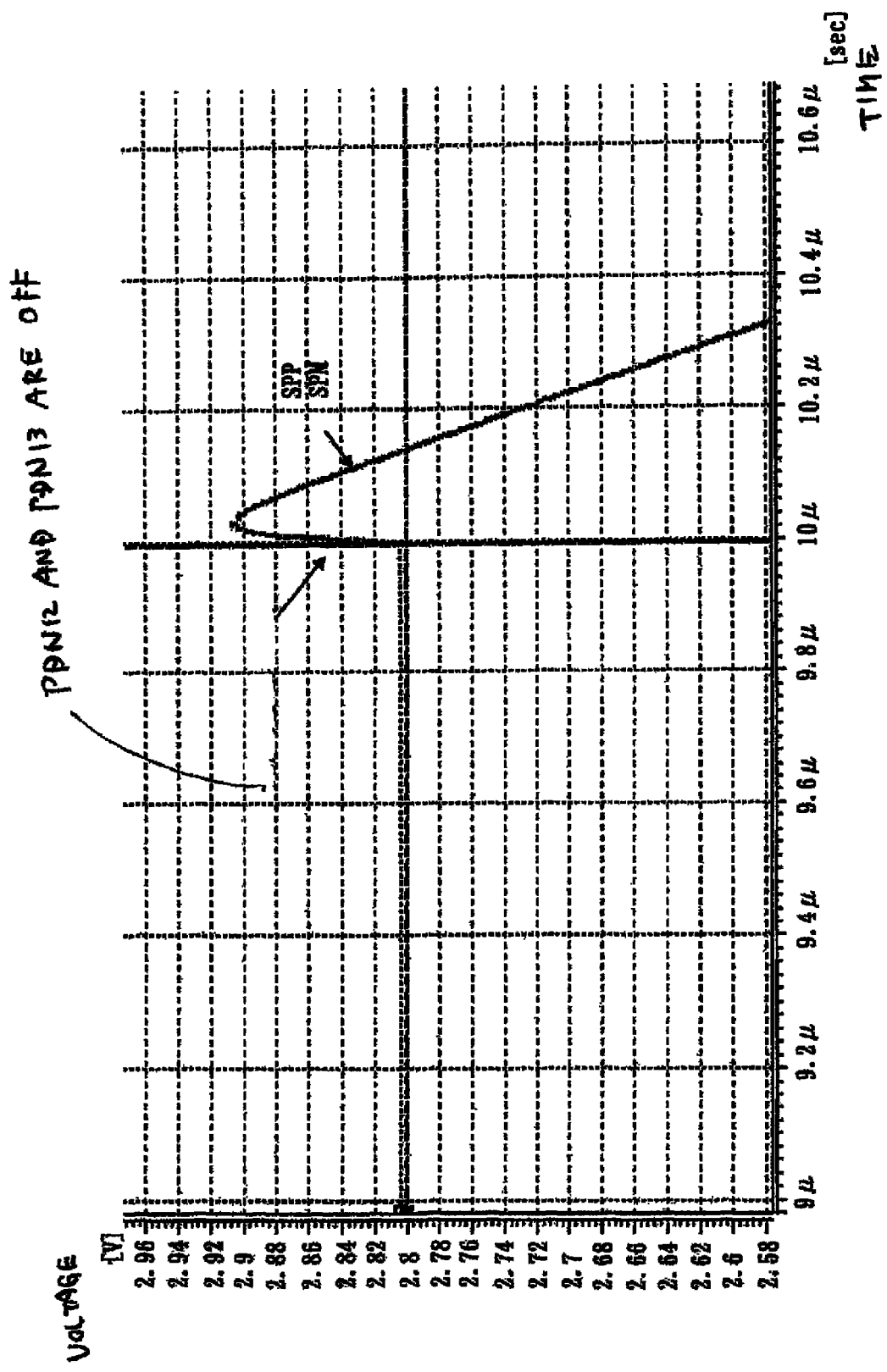
FIG. 6 is a voltage waveform diagram illustrating audio output signals SPP and SPM in FIG. 2.

FIGS. 3, 4 and 6 are respectively voltage waveform diagrams showing the audio output signals SPP and SPM shown in FIG. 2. FIG. 5 is an analytical diagram of fast Fourier transform (FFT) showing the audio output signals SPP and SPM shown in FIG. 2. The timing at which pop noise is generated corresponds to a portion where the voltage between the audio output signals SPP and SPM each corresponding to the output to the speaker 83 is assumed to vary 10 mV DC or more. That is, the timing corresponds to the timing at which each of the power-down signals PDN12 and PDN13 changes. Since the audio output signal SPM is also in phase at the timing with which the power-down signal PDN12 shown in FIG. 3 is brought to ON, although the audio output signal SPP changes, no difference in voltage occurs and hence the pop noise is not generated.

At the timing with which the power-down signal PDN13 shown in FIG. 4 is brought to ON, the speaker amplifier 60 is turned ON so that the audio output signal SPM varies until it reaches the reference voltage VCOM level. Since the audio output signal SPM varies, the audio output signal SPP operates from the reference voltage VCOM via the resistor of 8Ω of the external speaker 83 in conjunction with it. Since a difference in peak voltage between the audio output signals SPP and SPM by switching converges in 800 ns or so although the difference is 0.3V or so, it is not heard from the human ears as pop noise.

Executing the FFT analysis of FIG. 5 makes it possible to prove that the pop noise is not generated because it is of a signal component of −80 dB or less in an audible band (up to 20 kHz). Since the audio output signals SPP and SPM are simultaneously attenuated to 0V with the timing at which such power-down signals PDN12 and PDN13 as shown in FIG. 6 are brought to OFF simultaneously, no pop noise occurs.

If such a sequence as shown in FIG. 2 is conducted as described above, then the generation of pop noise can be prevented. Thus, according to the first preferred embodiment, the audio signal is directly output without AC-coupling the D/A-converted analog audio signal by means of the coupling capacitors. It is therefore possible to prevent the generation of pop noise by a relatively simple circuit configuration and control timing, and to reduce a layout area in a case where the audio output device is formed by a semiconductor device or the like.

Figure 7:
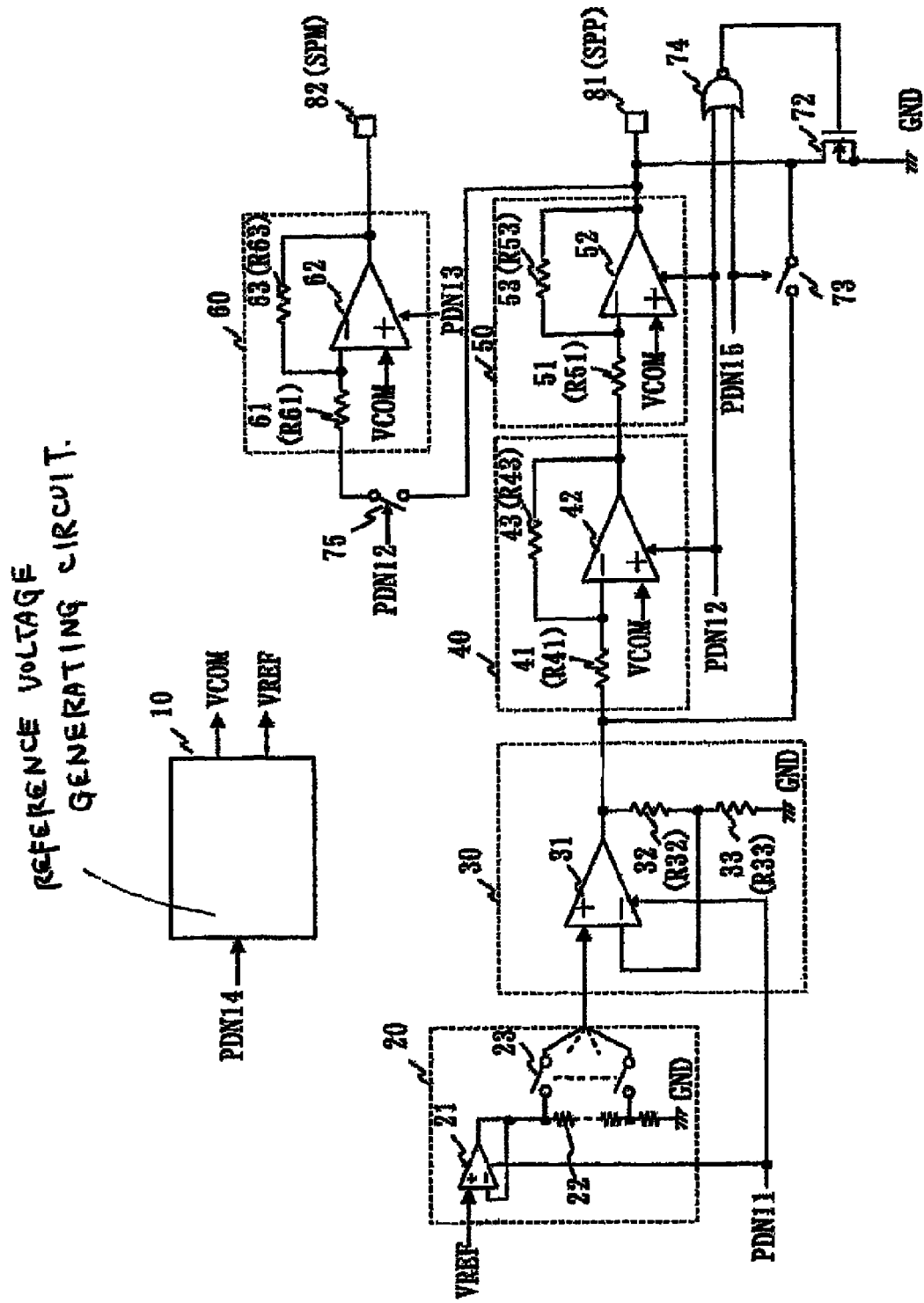
FIG. 7 is a schematic configuration diagram showing an audio output device illustrative of a second preferred embodiment of the present invention.

FIG. 7 is a schematic configuration diagram of an audio output device showing a second preferred embodiment of the present invention. Common reference numerals are respectively attached to elements common to those shown in FIG. 1 illustrative of the first preferred embodiment. Incidentally, while common symbols PDN11, PDN12, PDN13 and PDN14 are used as the power-down signals in FIGS. 1 and 7, FIGS. 1 and 7 are different from each other in transition timing.

In the audio output device according to the second preferred embodiment, no speaker is connected between first and second audio output terminals 81 and 82, and an audio output signal SPP is output from the first audio output terminal 81 to drive an electricity/audio converter (e.g., speaker) by means of external parts such as an amplifier, etc. Therefore, a switch 73 such as a transistor is connected between an output terminal of an amplifier main body 31 in a non-inverting amplifier 30 and the first audio output terminal 81. The ON/OFF-operation of the switch 73 is controlled by a fourth enable signal (e.g., power-down signal) PDN15. Further, an output controller is connected to the first audio output terminal 81 in place of the inverters 71 and NMOS 72 used in the first preferred embodiment.

The output controller in FIG. 7 controls the output of the audio output signal SPP from the first audio output terminal 81, based on a second enable signal (e.g., power-down signal) PDN12 for controlling the activation of an inverting amplifier 40 and a speaker amplifier 50, and the power-down signal PDN15 corresponding to the fourth enable signal. The output controller includes for example a negative OR circuit (hereinafter called "NOR circuit") 74 corresponding to a logic circuit and an NMOS 72 corresponding to a switch element. As should be understood, the NOR circuit 74 determines a logical OR of the power-down signals PDN12 and PDN15, and inverts the same. The gate of the NMOS 72 is connected to an output terminal of the NOR circuit 74. The drain and source of the NMOS 72 are respectively connected to the audio output terminal 81 and a constant potential node (e.g., ground) GND, and its ON/OFF-operation is controlled by a signal output from the NOR circuit 74. The present embodiment is similar to the first preferred embodiment in other configuration.

Figure 8:
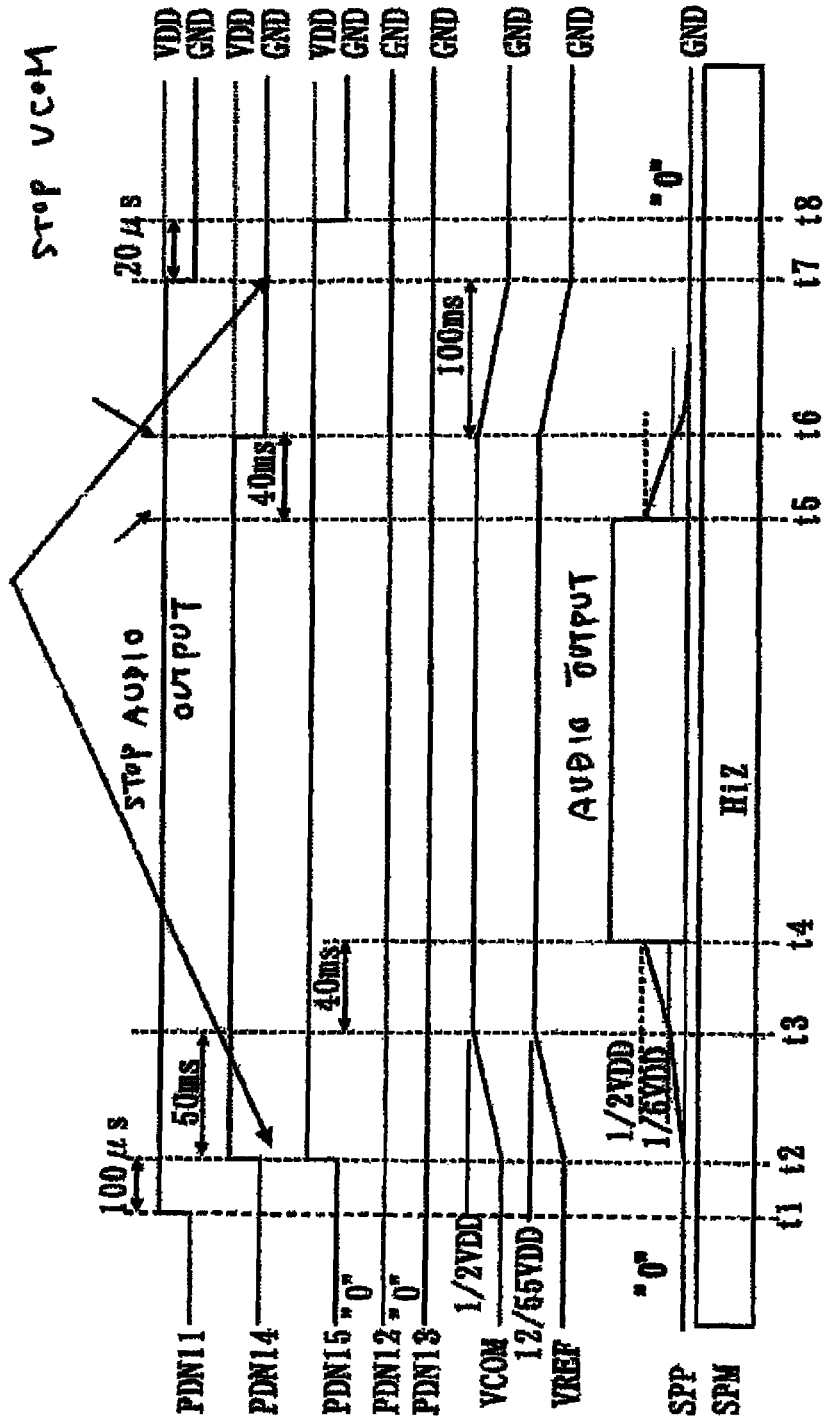
FIG. 8 is a timing chart illustrating an audio output method suitable for use in the audio output device shown in FIG. 7.

FIG. 8 is a timing chart showing one example of an audio output method used in the audio output device shown in FIG. 7. A description will first be made of on-startup of sound.

It is assumed that prior to a time t1 in FIG. 8, the power-down signal PDN11 corresponding to the first enable signal, the power-down signal PDN12 corresponding to the second enable signal, the power-down signal PDN13 corresponding to the third enable signal, and the power-down signal PDN15 corresponding to the fourth enable signal are respectively in an OFF state ("0"=GND level=0V), and reference voltages VREF and VCOM generated at a reference voltage generating circuit 10 are respectively of a startup-free state (=0V). It is also assumed that when the power-down signals PDN11, PDN12, PDN13 and PDN14 are OFF, the output signal of a D/A converter 20 is 0V, the output signal of the non-inverting amplifier 30 is 0V, and the inverting amplifier 40 and speaker amplifiers 50 and 60 per se are respectively in a high impedance (Hi-Z) output state. Since the gate of the NMOS 72 is at a VDD level, the NMOS 72 is turned ON so that the audio output signal SPP output from the audio output terminal 81 is brought to 0V. Since the power-down signal PDN12 is "0", a switch 75 is turned OFF so that the audio output signal SPM of the audio output terminal 82 is brought to the Hi-Z output state.

At a time t1 in FIG. 8 corresponding to a first timing, the power-down signal PDN11 is brought to an ON state. With turning ON of the power-down signal PDN11, the D/A converter 20 and the non-inverting amplifier 30 are started up. A digital value (digital audio signal) corresponding to the lowest voltage output (4/55×VDD) is input to the D/A converter 20 (switch 23). The D/A converter 20 and the non-inverting amplifier 30 respectively have offset voltages when the reference voltage VREF is 0V. In the second preferred embodiment, the D/A converter 20 has 2.3 mV offset voltage and the non-inverting amplifier 30 has 4.7 mV offset voltage.

At a time t2 in FIG. 8 corresponding to a second timing, the power-down signals PDN14 and PDN15 are brought to an ON state after 100 μs has elapsed from the turning ON of the power-down signal PDN11, and the reference voltages VCOM and VREF generated from the reference voltage generating circuit 10 are started up. The reference voltages VCOM and VREF are respectively of voltages which rise with the time constant of the resistors 13 through 15 and the capacitor 16 in FIG. 1. Since the time of 100 μs corresponds to the time taken until the non-inverting amplifier 30 becomes stable, it is variable by the stable speed of the non-inverting amplifier 30. In the non-inverting amplifier 30, the ratio of resistance values R32/R33 is assumed to be 31/24. The non-inverting amplifier 30 outputs 7 mV obtained by adding the offset voltages of the D/A converter 20 and the non-inverting amplifier 30. With turning ON of the power-down signal PDN15, the switch 73 is turned ON so that the output signal of the non-inverting amplifier 30 is output from the audio output terminal 81 as an audio output signal SPP.

At a time t3 in FIG. 8, the output voltage of the D/A converter 20 becomes 4/55×VDD to stabilize the reference voltage VREF after 50 ms from the turning ON of the power-down signal PDN14. Thus, the output voltage of the non-inverting amplifier 30 rises from 7 mV to ⅙×VDD (=4/55× 55/24×VDD).

At a time t4 in FIG. 4, the output voltage of the D/A converter 20 is raised up to the center voltage (12/55×VDD) of the D/A converter 20 for 40 ms. Thus, the output voltage of the non-inverting amplifier 30 is raised from ⅙×VDD to ½VDD (=12/55×55/24×VDD)=VCOM. Thereafter, the audio output signal SPP is sent out from the audio output terminal 81. Although 40 ms depends on the resolution of the D/A converter 20, it can be changed if one code step of the D/A converter 20 is stepped up within 10 mV.

The stop of sound will next be explained. When the output level of the D/A converter 20 reaches a center voltage value in an audio sent-out state at a time between the time t4 and a time t5 in FIG. 8, a digital code (digital audio signal) is input to the D/A converter 20 (switch 23) in such a manner that the output level is set from the center voltage value to the lowest voltage output (4/55×VDD) for 40 ms. Although 40 ms depends on the resolution of the D/A converter 20, it can be changed if one code step of the D/A converter 20 is stepped down within 10 mV.

At a time between the audio transmission stop at the time t5 and a time t6 in FIG. 8 subsequent to the elapse of 40 ms, the power-down signal PDN14 is brought to OFF, and the reference voltages VREF and VCOM are set in power down. The electric charge of the capacitor is gradually discharged via the resistors 13 through 15 and capacitor 16 in the reference voltage generating circuit 10 of FIG. 1, so the reference voltages VREF and VCOM reach 0V after 100 ms. The D/A converter 20 and the non-inverting amplifier 30 respectively take offset voltages when the reference voltage VREF is 0V. In the second preferred embodiment, the D/A converter 20 takes 2.3 mV and the non-inverting amplifier 30 takes 4.7 mV. The audio output signal SPP of 7 mV obtained by adding the offset voltages of the D/A converter 20 and the non-inverting amplifier 30 is output from the audio output terminal 81.

At a time t7 in FIG. 8 corresponding to a third timing, the power-down signal PDN11 is brought to an OFF state after 100 ms from the turning OFF of the power-down signal PDN14. With the turning OFF of the power-down signal PDN11, the output signals of the D/A converter 20 and the non-inverting amplifier 30 become 0V and the audio output signal SPP is also brought to 0V. 100 ms is a time interval stable until the reference voltages VREF and VCOM reach 0V, and is variable.

At a time t8 in FIG. 8 corresponding to a fourth timing, the power-down signal PDN15 is brought to an OFF state after 20 μs from the turning OFF of the power-down signal PDN11. Since the gate of the NMOS 72 reaches the VDD level in a manner similar to the first preferred embodiment, the audio output signal SPP is 0V. Incidentally, although the power-down signals PDN11 and PDN15 may be brought to OFF simultaneously, the difference in timing is provided in consideration of noise at the simultaneous OFF in the second preferred embodiment.

(Effects of Second Preferred Embodiment)

Figure 9:
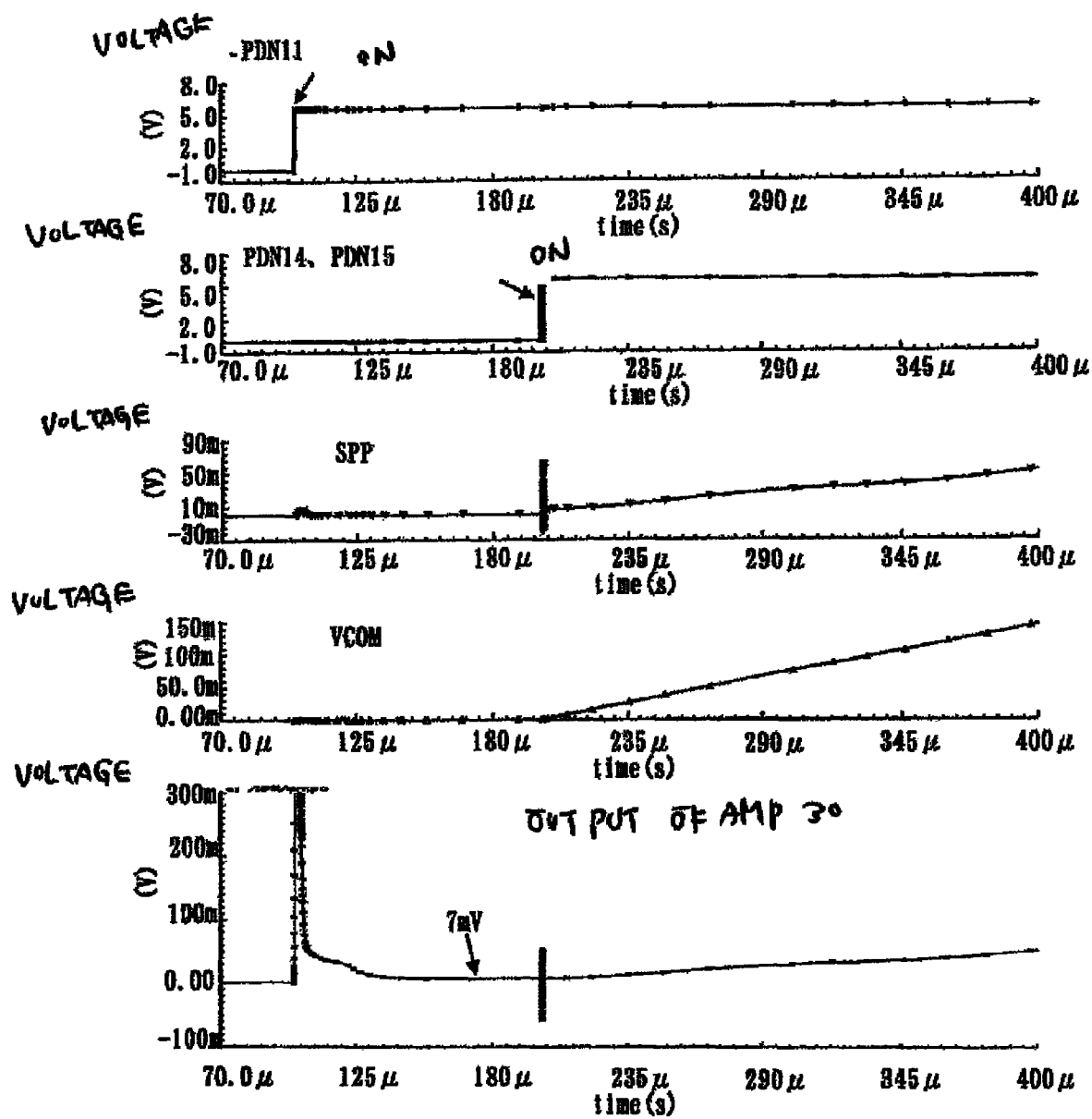
FIG. 9 is a voltage waveform diagram showing power-down signals PDN11, PDN14 and PDN15, an audio output signal SPP, a reference voltage VCOM and an output signal of a non-inverting amplifier 30 in FIG. 8.
Figure 10:
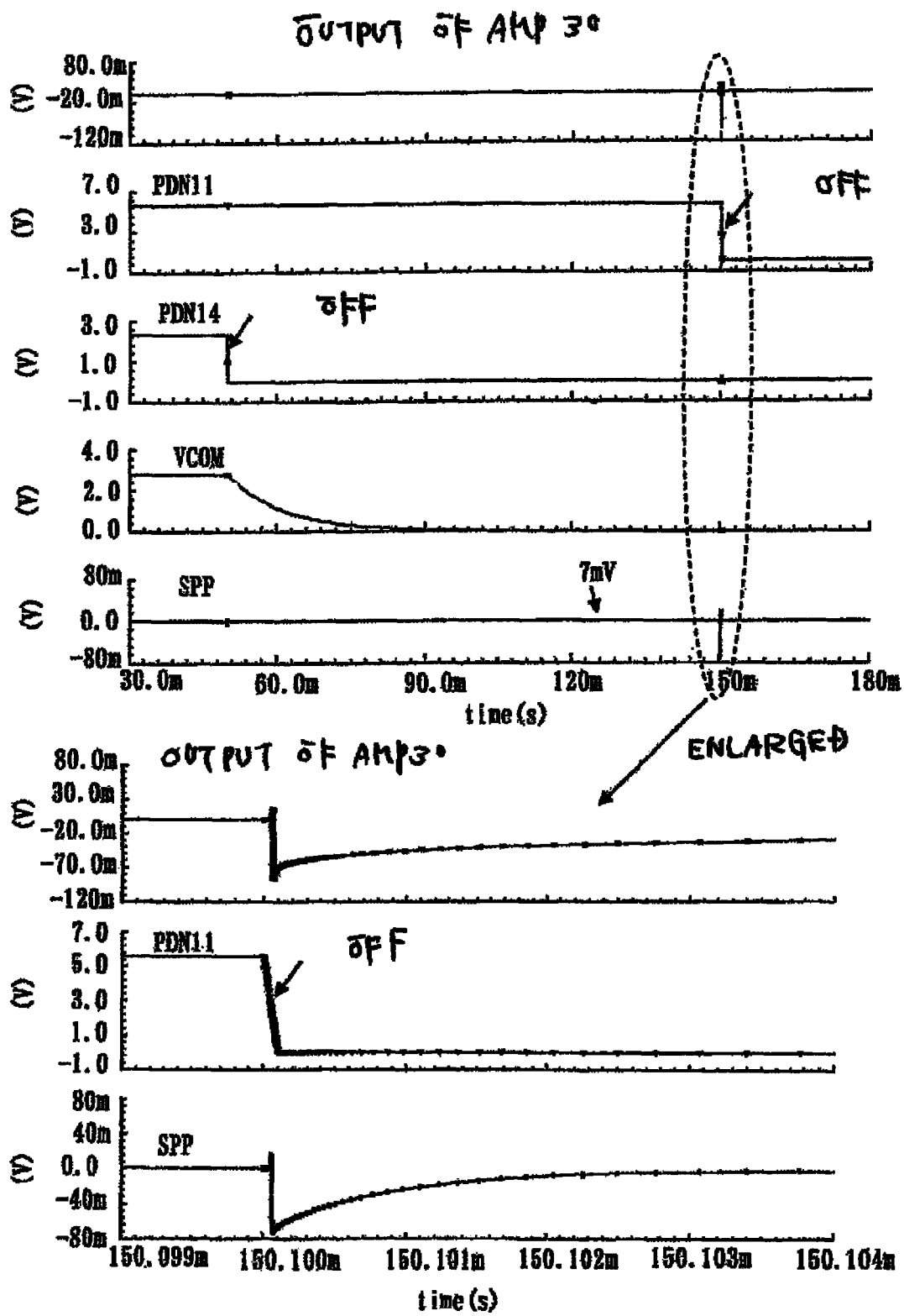
FIG. 10 is a voltage waveform diagram showing power-down signals PDN11 and PDN14, an audio output signal SPP, a reference voltage VCOM and an output signal of the non-inverting amplifier 30 in FIG. 8.
Figure 11:
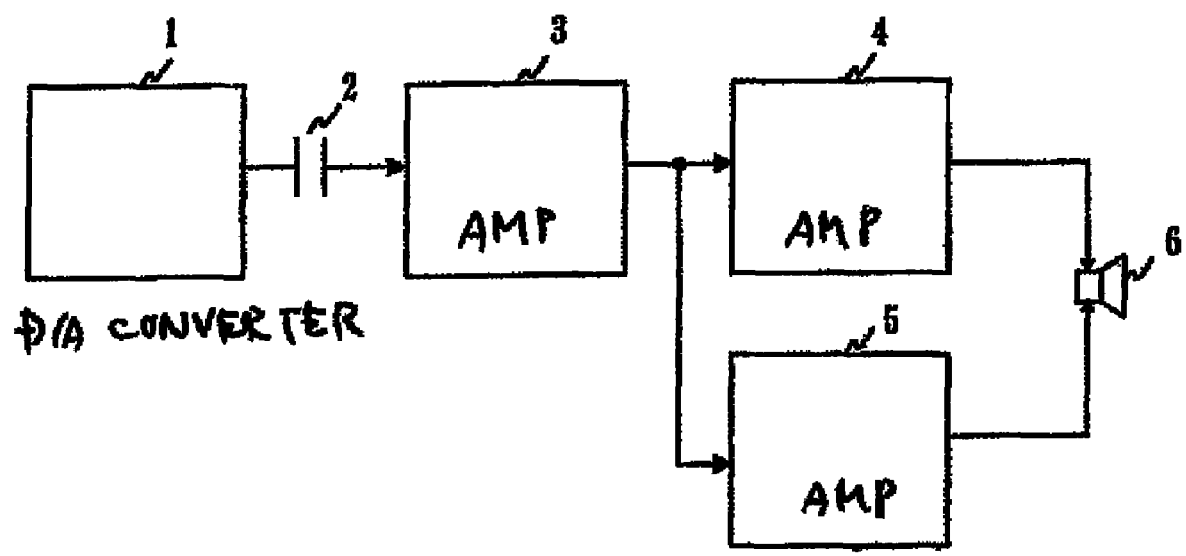
FIG. 11 is a schematic configuration diagram showing a conventional audio output device.

FIG. 9 is a voltage waveform diagram showing the power-down signals PDN11, PDN14 and PDN15, audio output signal SPP, reference voltage VCOM, and output signal of the non-inverting amplifier 30 in FIG. 8. FIG. 10 is a voltage waveform diagram showing the power-down signals PDN11 and PDN14, audio output signal SPP, reference voltage VCOM, and output signal of the non-inverting amplifier 30 in FIG. 8.

The timing at which pop noise is generated, corresponds to a portion where the voltage of the audio output signal SPP corresponding to an external output is assumed to vary 10 mV DC or more. That is, the timing corresponds to each of the second timing (time t2) at which the power-down signal PDN15 is brought to ON/OFF and the third timing (time t7) at which the power-down signal PDN11 is brought to OFF.

At the second timing (time t2) at which the power-down signal PDN15 shown in FIG. 9 is brought to an ON state, the DC voltage changes from 0V to 7 mV (equivalent to the value obtained by adding the offset voltages of the D/A converter 20 and the non-inverting amplifier 30) from the audio output signal SPP. Since, however, the DC voltage is less than or equal to 10 mV, no pop noise is generated. Incidentally, it is necessary to adjust the total offset of the D/A converter 20 and the non-inverting amplifier 30 to 10 mV or less.

At the third timing (time t7) at which the power-down signal PDN11 shown in FIG. 10 is brought to an OFF state, the DC voltage varies from 7 mV (equivalent to the value obtained by adding the offset voltages of the D/A converter 20 and the non-inverting amplifier 30) to 0V by the audio output signal SPP. Since, however, a variation in the DC voltage other than switching noise is 10 mV or less, no pop noise is generated. At a fourth timing (time t8) at which the power-down signal PDN15 is brought to OFF, no pop noise is generated because there is no other switching noise.

If such a sequence as shown in FIG. 8 is carried out, then the generation of pop noise can be prevented. Thus, according to the second preferred embodiment, the audio signal is directly output without AC-coupling the D/A-converted analog audio signal by means of the coupling capacitors in a manner approximately similar to the first preferred embodiment. It is therefore possible to prevent the generation of pop noise by a relatively simple circuit configuration and control timing, and to reduce a layout area in the case where the audio output device is formed by a semiconductor device or the like.

The present invention is not limited to the above embodiments. Various use forms and modifications are possible. As the use forms and modified examples, the following (a) through (c) are cited, for example.

(a) The reference voltage generating circuit 10, the D/A converter 20 and the amplifiers 30 through 60 or the like may be configured by circuits other than those illustrated in the figures.

(b) Other electricity/audio converters such as earphones, headphones, etc. may be used in place of the speaker 83.

(c) The audio output methods suitable for use in the audio output devices shown in FIGS. 1 and 7 can be changed to other signal timings or the like other than those shown in FIGS. 2 and 8.

The present invention is available for the design of an integrated circuit (IC) or the like provided with various audio outputs which have recently been seen in large numbers, by making good use of the characteristics of the method for preventing the generation of pop noise. The present invention is available for the design of, for example, communication equipment such as a cellular phone, toys, household electrical appliances such as a refrigerator, etc.

What is claimed is:

1. An audio output device comprising:
    a digital/analog converter that converts a digital audio signal to an analog audio signal;
    a first amplifier that is activated along with the digital/analog converter and that amplifies the analog audio signal with a predetermined center voltage as a reference to provide an output signal;
    a second amplifier that is activated responsive to a transition of a first enable signal to a first logic level from a second logic level at a first timing subsequent to activation of the first amplifier to amplify the output signal of the first amplifier and to provide a first amplified signal, the second amplifier outputs the first amplified signal to an electricity/audio converter, and stops output of the first amplified signal to the electricity/audio converter responsive to a transition of the first enable signal to the second logic level at a third timing subsequent to the first timing; and
    a third amplifier that has the first amplified signal input thereto responsive to the transition of the first enable signal to the first logic level at the first timing, the third amplifier is activated responsive to a transition of a second enable signal to the first logic level from the second logic level at a second timing between the first and third timings to amplify the first amplified signal and to provide a second amplified signal, the third amplifier outputs the second amplified signal to the electricity/audio converter, and stops output of the second amplified signal to the electricity/audio converter responsive to a transition of the second enable signal to the second logic level at the third timing.

2. The audio output device according to claim 1, wherein the first amplifier comprises a non-inverting amplifier that amplifies the analog audio signal output from the digital/analog converter with a same phase to provide the output signal,
    wherein the second amplifier comprises a first inverting amplifier that inverts and amplifies the output signal from the non-inverting amplifier, and a second inverting amplifier that inverts and amplifies an output signal of the first inverting amplifier to provide the first amplified signal, and
    wherein the third amplifier comprises a third inverting amplifier that inverts and amplifies the first amplified signal to provide the second amplified signal.

3. An audio output device comprising:
    a digital/analog converter that is activated responsive to a transition of a first enable signal to a first logic level from a second logic level at a first timing to convert a digital audio signal to an analog audio signal at a second timing subsequent to the first timing, the digital/analog converter outputs the analog audio signal, and stops output of the analog audio signal responsive to a transition of the first enable signal from the first logic level to the second logic level at a third timing subsequent to the second timing;
    a first amplifier that is activated responsive to the transition of the first enable signal to the first logic level at the first timing to amplify the analog audio signal at the second timing with a predetermined center voltage as a reference to provide an output signal, the first amplifier stops output of the output signal responsive to the transition of the first enable signal to the second logic level;
    a second amplifier that is activated responsive to a second enable signal to amplify the output signal of the first amplifier to provide a first amplified signal, the second amplifier outputs the first amplified signal to a first audio output terminal, and stops output of the first amplified signal to the first audio output terminal responsive to of the second enable signal;
    a third amplifier that has the first amplified signal input thereto responsive to the second enable signal, the third amplifier is activated responsive to a third enable signal to amplify the first amplified signal, the third amplifier outputs a second amplified signal to a second audio output terminal, and stops output of the second amplified signal to the second audio output terminal responsive to the third enable signal;
    a switch which is switched to an ON state responsive to a transition of a fourth enable signal to the first logic level from the second logic level at the second timing to provide the output signal of the first amplifier to the first audio output terminal, the switch is switched to an OFF state responsive to a transition of the fourth enable signal to the second logic level at a predetermined timing subsequent to the third timing to stop output of the output signal to the first audio output terminal; and
    an output controller that controls an output from the first audio output terminal, based on a logical OR of the second and fourth enable signals.

4. The audio output device according to claim 3, wherein the first amplifier comprises a non-inverting amplifier that amplifies the analog audio signal output from the digital/analog converter with a same phase to provide the output signal,
    wherein the second amplifier comprises a first inverting amplifier that inverts and amplifies the output signal from the non-inverting amplifier, and a second inverting amplifier that inverts and amplifies an output signal of the first inverting amplifier to provide the first amplified signal, and
    wherein the third amplifier comprises a third inverting amplifier that inverts and amplifies the first amplified signal to provide the second amplified signal.

5. The audio output device according to claim 3, wherein the output controller includes a logic circuit that determines the logical OR of the second and fourth enable signals, and
    a switch element that is connected between the first audio output terminal and a predetermined potential node, and is switched responsive to an output signal of the logic circuit.

6. An audio output method comprising:
 converting a digital audio signal to an analog audio signal;
 a first amplifying that amplifies the analog audio signal using a predetermined center voltage as a reference to provide an output signal;
 a second amplifying that amplifies the output signal at a first timing subsequent to activation of said first amplifying, said second amplifying activated responsive to a transition of a first enable signal to a first logic level from a second logic level, to output a first amplified signal;
 a third amplifying that amplifies the first amplified signal responsive to a transition of a second enable signal to the first logic level from the second logic level, to output a second amplified signal,
 the first amplified signal provided for said third amplifying responsive to the transition of the first enable signal to the first logic level;
 applying the first amplified signal to an electricity/audio converter at a second timing subsequent to the first timing;
 providing the second amplified signal to the electricity/audio converter;
 stopping output of the first amplified signal responsive to a transition of the first enable signal to the second logic level at a third timing subsequent to the second timing; and
 stopping output of the second amplified signal responsive to a transition of the second enable signal to the second logic level.

7. An audio output method comprising:
 converting a digital audio signal to an analog audio signal, said converting activated responsive to a transition of a first enable signal to a first logic level from a second logic level at a first timing, when a reference voltage is provided for said converting at a second timing subsequent to the first timing;
 a first amplifying that amplifies the analog audio signal using a predetermined center voltage as a reference to provide an amplified signal, said first amplifying activated responsive to the transition of the first enable signal to the first logic level;
 providing the amplified signal to an audio output terminal via a switch switched to an ON state by a transition of a second enable signal to the first logic level from the second logic level;
 transitioning the first enable signal to the second logic level at a third timing subsequent to the second timing, to deactivate said converting and said first amplifying; and
 stopping output from the audio output terminal responsive to a transition of the second enable signal to the second logic level at a fourth timing subsequent to the third timing.

* * * * *